(12) United States Patent
Dolian

(10) Patent No.: US 7,397,264 B2
(45) Date of Patent: Jul. 8, 2008

(54) METHOD FOR TESTING POWER MOSFET DEVICES

(75) Inventor: Krikor M. Dolian, Arcadia, CA (US)

(73) Assignee: Dolian Graphics, Inc., Baldwin Park, CA (US)

( * ) Notice: Subject to any disclaimer, the term of this patent is extended or adjusted under 35 U.S.C. 154(b) by 320 days.

(21) Appl. No.: 11/208,800

(22) Filed: Aug. 22, 2005

(65) Prior Publication Data

US 2007/0040571 A1    Feb. 22, 2007

(51) Int. Cl.
*G01R 31/26* (2006.01)
(52) U.S. Cl. .................................... 324/769
(58) Field of Classification Search ............... 324/765, 324/755, 763, 158.1, 768–769; 257/330–336, 257/48; 438/159, 157, 401
See application file for complete search history.

(56) References Cited

U.S. PATENT DOCUMENTS

| 5,602,487 | A | * | 2/1997 | Manku | 324/678 |
| 6,069,485 | A | * | 5/2000 | Long et al. | 324/769 |
| 6,166,558 | A | * | 12/2000 | Jiang et al. | 324/769 |
| 7,176,706 | B2 | * | 2/2007 | Toshiyuki et al. | 324/765 |

OTHER PUBLICATIONS

Laslo Balogh, "Design and Application Guide for High Speed MOSFET Gate Drive Circuits", pp. 2-1 thru 2-39, Copyright © 2002, Texas Instruments Incorporated.
Brian R. Pelly, "The Do's and Don'ts of Using Power HEXFETs®", International Rectifier, Application Note 936A, pp. 1535-1540.
Steve Clemente, "Gate Drive Characteristics and Requirements for Power HEXFETs®", International Rectifier, Application Note 937B, pp. 1541-1548.
Brian R. Pelly, "A New Gate Charge Factor Leads to Easy Drive Design for Power MOSFET Circuits", International Rectifier, Application Note 944A, pp. 1549-1552.

* cited by examiner

*Primary Examiner*—Ha Tran Nguyen
*Assistant Examiner*—Tung X. Nguyen
(74) *Attorney, Agent, or Firm*—Fulwider Patton LLP

(57) ABSTRACT

Characteristics of a power MOSFET gate charge test waveform are evaluated to yield a highly reliable and uniform testing methodology that replaces the inconsistent and inefficient dv/dt immunity testing currently performed. The invention utilizes the ratio of $Q_{GD}$ over $Q_{GS1}$ to replace traditional dv/dt immunity testing in order to perform binning and sorting the devices. The ratio of $Q_{GD}$ over $Q_{GS1}$ has proven to be a very reliable substitute for standard dv/dt immunity tests, and a very accurate predictor of a power MOSFET's suitability for a specified purpose. Because the gate charge parameters are relatively easily measured with high accuracy, and independent of test set-up or tester, reliability is far greater than previous methods and improved efficient results. Additional ratios of charge parameters enhance the performance of the testing methodology of the present invention.

2 Claims, 2 Drawing Sheets

METHOD FOR TESTING POWER MOSFET DEVICES

FIELD OF THE INVENTION

The present invention relates generally to the testing of semiconductor devices, and more particularly to a method for screening and binning power MOSFET devices based on specific ratios obtained from a gate charge waveform graph.

BACKGROUND OF THE INVENTION

The power semiconductor industry uses various tests to validate and categorize the product worthiness of a particular semiconductor for specific applications. The subject of the present invention is a novel testing system comprising a method and apparatus tailored to test power MOSFET devices in lieu of less reliable tests such as dv/dt immunity tests, leading to improved yields and more reliable validation.

Metal oxide semiconductor field effect transistors (MOSFETs) are used in certain circuit applications as a control switch, where its purpose is primarily to control the drain current via the gate voltage. An overview of the structure of the MOSFET is well known in the art, and many references detail the features of the power MOSFET such as the technical note by Vrej Barkhordarian, which can be found at http://www.irf.com/technical-info/appnotes/mosfet.pdf, the contents of which are fully incorporated herein by reference.

A MOSFET's switching performance is an important feature of the device characterized voltage change rate (dv/dt) across a capacitor. For example, $R_G$ can represent the distributed resistance of the gate, and its value is (approximately) inversely proportional to the active area. $L_S$ and $L_D$ represent source and drain lead inductances, respectively. The values of input ($C_i$), output ($C_o$) and reverse transfer ($C_r$) capacitances are used by circuit designers as a starting point in determining circuit component values.

Data sheet capacitances are defined in terms of the equivalent circuit capacitances as:

$C_i = C_{GS} + C_{GD}$, ($C_{DS}$ shorted)

$C_r = C_{GD}$ $C_o = C_{DS} + C_{GD}$

The gate-to-drain capacitance, $C_{GD}$, is a nonlinear function of voltage and is the most important parameter because it provides a feedback loop between the output and the input of the circuit. $C_{GD}$ is also called the Miller capacitance because it causes the total dynamic input capacitance to become greater than the sum of the static capacitances.

Although input capacitance values are useful, they do not provide accurate results when comparing the switching performances of two devices from different manufacturers. Rather, size effects and transconductance hinder such comparisons. To overcome this limitation, it has been found that the gate charge, rather than capacitance, is a more useful parameter from the circuit design point of view.

FIG. 1 shows a typical gate charge waveform and FIG. 2 illustrates a test circuit that could be associated with the graph of FIG. 1. Referring to FIGS. 1 and 2 collectively, when the gate is connected to a supply voltage (i.e., switch S is opened), $V_{GS}$ starts to increase until it reaches a threshold voltage $V_{TH}$, at which point the drain current $I_d$ starts to flow and the $C_{GS}$ starts to charge. The charge associated with this period between t0 and t1 is referred to as $Q_{GS1}$, as shown in FIG. 1. After the threshold voltage is reached at t1, $C_{GS}$ continues to charge and the gate voltage continues to rise as the drain current rises proportionally. At time t2, $C_{GS}$ is completely charged and the drain current reaches the predetermined current $I_D$ and stays constant while the drain voltage starts to fall. The charge associated with this portion of the graph between t1 and t2 is $Q_{GS2}$, also shown in FIG. 1. When $C_{GS}$ is fully charged at t2, $V_{GS}$ becomes constant and the drive current starts to charge the Miller capacitance, $C_{DG}$. This continues until time t3.

Charge time for the Miller capacitance is larger than that for the gate to source capacitance $C_{GS}$ due to the rapidly changing drain voltage between t2 and t3 (current=Cdv/dt). Once both of the capacitances $C_{GS}$ and $C_{GD}$ are fully charged, gate voltage ($V_{GS}$) starts increasing again until it reaches the supply voltage at time t4. The gate charge $Q_{Gmin}$ (=$Q_{GS}$+$Q_{GD}$) corresponding to time t3 is the bare minimum charge required to switch the device on. Good circuit design practice dictates the use of a higher gate voltage than the bare minimum required for switching, and therefore the gate charge used in the calculations is $Q_G$ corresponding to t4. The advantage of using gate charge is that the designer can easily calculate the amount of current required from the drive circuit to switch the device on in a desired length of time because Q=CV and I=Cdv/dt, the Q=Time*current.

Peak diode recovery is an important consideration of MOSFET operation and is defined as the maximum rate of rise of drain-source voltage allowed, i.e., dv/dt capability. If this rate is exceeded, then the voltage across the gate-source terminals may become higher than the threshold voltage of the device, forcing the device into current conduction mode, and under certain conditions a catastrophic failure may occur. There are two possible mechanisms by which a dv/dt induced turn-on may take place. FIG. 3 shows the equivalent circuit model of an N-channel power MOSFET, including a parasitic bipolar power junction transistor (BJT).

The first mechanism of dv/dt induced turn-on becomes active through the feedback action of the gate-drain capacitance, $C_{GD}$. When a voltage ramp appears across the drain and source terminal of the device, a current $I_1$ flows through the gate resistance, $R_G$, by means of the gate-drain capacitance, $C_{GD}$. $R_G$ represents the total gate resistance in the circuit, and the voltage drop across it is given by:

$V_{GS} = I_1 * R_G = R_G * C_{GD}(\text{dv/dt})$

When the gate voltage $V_{GS}$ exceeds the threshold voltage of the device $V_{TH}$, the device is forced into conduction. The dv/dt capability for this mechanism is thus set by:

$\text{dv/dt} = V_{TH}/(R_G * C_{GD})$

From the foregoing, it is clear that devices with a low threshold voltage VTH are more prone to unwanted dv/dt turn-on. Gate circuit impedance must be carefully considered to avoid this phenomenon. The second mechanism for the dv/dt turn-on in power MOSFETs is through the parasitic BJT. The capacitance associated with the depletion region of the body diode extending into the drift region is denoted as $C_{DB}$ and appears between the base of the BJT and the drain of the MOSFET. This capacitance gives rise to a current I2 to flow through the base resistance $R_B$ when a voltage ramp appears across the drain-source terminals. With analogy to the first mechanism, the dv/dt capability of this mechanism is:

$\text{dv/dt} = V_{BE}/(R_B * C_{DB})$

If the voltage that develops across RB is high enough, then the base-emitter junction is forward-biased and the parasitic BJT is turned on. Under the conditions of high dv/dt and large values of $R_B$, the breakdown voltage of the MOSFET will be limited to that of the open base breakdown voltage of the BJT. If the applied drain voltage is greater than the open-base breakdown voltage, then the MOSFET will enter avalanche mode if the current is not externally limited. Increasing the dv/dt capability therefore requires reducing the base resistance $R_B$ by increasing the body region doping and reducing the distance current $I_2$ has to flow laterally before it is collected by the source metallization. As in the first mode, the BJT related dv/dt capability becomes worse at higher temperatures because $R_B$ increases and $V_{BE}$ decreases with increasing temperature.

While the data sheets of power MOSFETs include different specifications, most often some very important parameters such as gate resistance $R_G$ and gate charge $Q_G$ are not directly measured despite directly affecting the switching performance of the devices. The increased need for more efficient and robust designs, such as nonisolated synchronous buck power converters and other devices driven by the portable electronic equipment, led manufacture to be keenly interested in having the above identified parameters tested and confirmed before delivery. To meet the needs of the customers, internal gate resistance testers were developed such as the DG900-2 and DG500 by the assignee of the present application, Dolian Graphics, Inc. of Baldwin Park, Calif. Test procedures were integrated into existing testing procedures to form complete testing systems such as the Integrated Rg/Gc Test System by Dolian.

The desired high switching frequencies are limited by the switching losses in the high-side MOSFET. As the MOSFET transitions on and off more rapidly, the switching losses are reduced. However, increasing the on and off transitions result in a more susceptible low-side MOSFET to dv/dt induced turn-on. Dv/dt turn-on occurs when the synchronous MOSFET is active despite the gate-drive signal's command to turn off. In a buck power converter, for example, when the high-side MOSFET is on, the low side must be off. If the dv/dt is such that it turns on the synchronous MOSFET on, a shoot-through current can result as a result of simultaneous conduction of both MOSFETs. As stated above, when the applied dv/dt results in a gate voltage that exceeds the MOSFET gate-to-source threshhold voltage, the converter's reliability and overall efficiency suffers. Thus, one critical parameter for testing the semiconductor is dv/dt immunity. Dv/dt immunity is characteristic of a MOSFET to resist inadvertently turning on in the presence of a high Cdv/dt presence.

Testing for dv/dt immunity is at the forefront of validation through testing in the semiconductor industry. Although much work has gone into improving the dv/dt immunity test, it is still very unreliable and requires high limits or tolerance to be placed on the bands of acceptable components. These high bands or tolerance lead to many viable and operable components being discarded for failing the tolerances limits, and the imprecision of existing testing still allows too high of a percentage of bad components to incorrectly pass the test and be delivered to customers. A bad component is then typically installed into a larger component whose failure is much more costly than replacing the original semiconductor. The inefficiency of the percentage of excluding working components along with falsely passed non-working components has led to the search for more reliable testing of power MOSFETs using existing testing equipment. Further, a difficulty with present dv/dt testing is that it is highly test set-up sensitive, in that results vary widely from one set-up and one tester to another. This disparity leads to inconsistency and higher limits to avoid the false positive passing of a bad component.

SUMMARY OF THE INVENTION

The present invention uses characteristics of the gate charge waveform to test power MOSFETs in a new and unexpected way to produce a highly reliable and uniform testing methodology that replaces the inconsistent and inefficient dv/dt immunity testing currently performed. The test centers on the ratio of $Q_{GD}$ over $Q_{GS1}$, where this ratio can be used for binning and sorting the devices. The ratio of $Q_{GD}$ over $Q_{GS1}$ is a unique parameter to semiconductor testing as a substitute for more complicated and less reliable dv/dt immunity testing, and a very accurate predictor of a power MOSFET's suitability for a specified purpose. In particular, a semiconductor with a properly classified ratio of $Q_{GD}$ over $Q_{GS1}$ has a very high probability of passing a comparible dv/dt immunity test for the intended application. The test will allow semiconductor manufacturers to assure its customers that properly selected and tested components will pass dv/dt immunity with greater yields and fewer failures. Because the gate charge parameters are relatively easily measured with high accuracy, and independent of test set-up or tester, reliability is far greater than previous methods and improved efficient results.

Using a second ratio of the gate charge waveform can further enhance the reliability and predictability of the testing procedure. For example, if $Q_G$ is defined as the charge from t0 to the point on the gate charge waveform where the supply (or driving) voltage $V_{GS}$ is equal to the actual gate voltage of the device, the ratio of $Q_{GD}$ over $Q_G$ is a secondary predictor that when coupled with the first ratio further improves the accuracy of the method of the present invention. Other ratios employing $Q_{Gmin}$, $Q_{GS1}$, $Q_G$, $Q_{GD}$, and $Q_{GS}$ leads to even greater reliability and precision.

Other features and advantages of the invention will become apparent from the following detailed description, taken in conjunction with the accompanying drawing which illustrates, by way of example, a method of the type benefiting from the disclosed invention.

DETAILED DESCRIPTION OF THE INVENTION

The structure of the power MOSFET is such that a parasitic bipolar transistor is inherent. Accordingly, N-channel MOSFET's include a parasitic NPN transistor, while P-channel MOSFET's include a parasitic PNP transistor. Under conditions where the rate of change of the Drain to Source voltage is below a given threshold, the parasitic transistor remains in the off state. However, in cases where the Drain to Source voltage changes rapidly, the parasitic transistor Q2 (see FIG. 3) may turn-on and provide a current conduction. When this occurs, current flow is limited to a small fraction of the semiconductor die. This in turn results in localized heating, which in many cases causes the destruction of the die and failure of the transistor.

Figure 3:
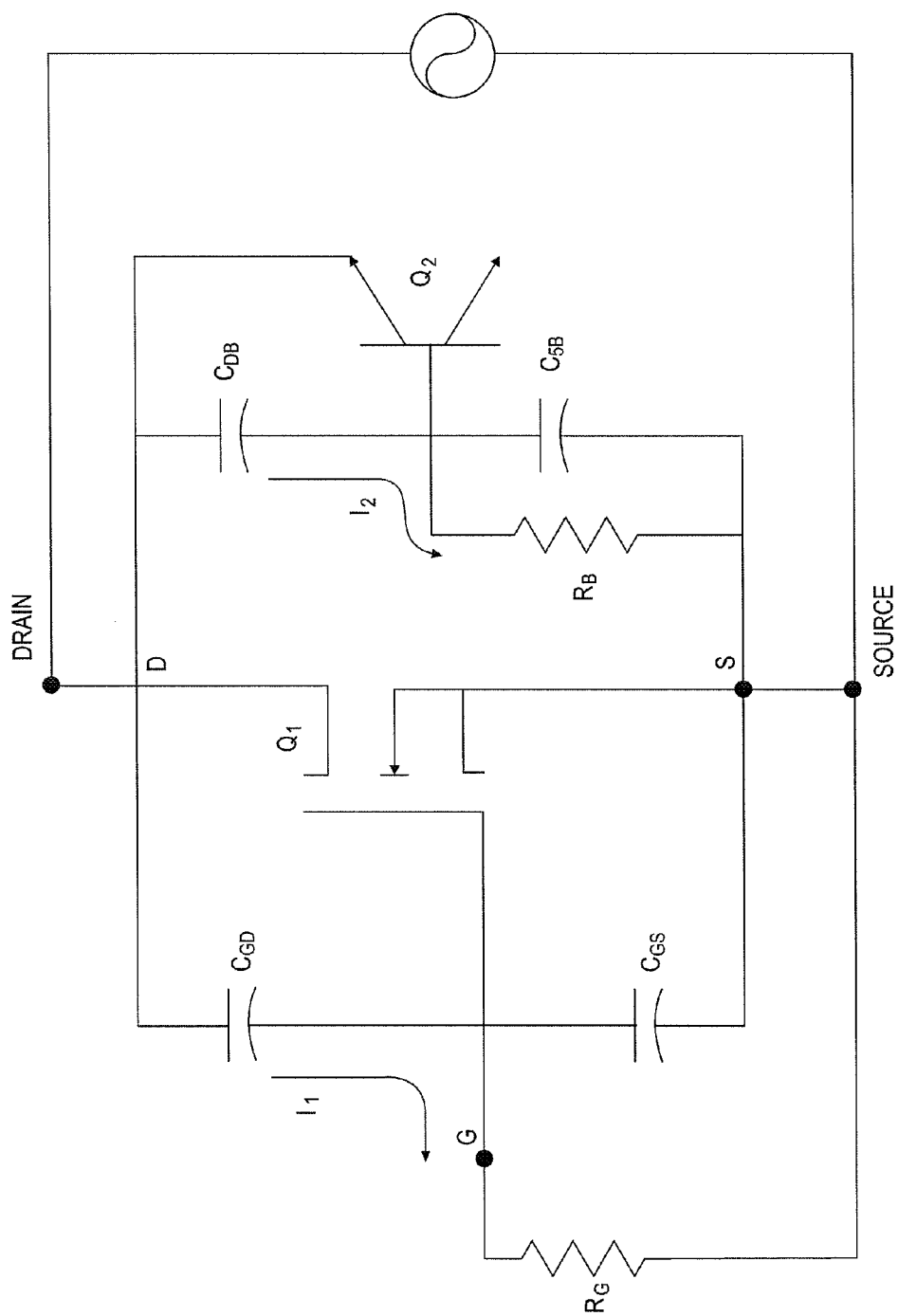
FIG. 3 is a schematic of an equivalent circuit for an n-channel MOSFET.

Referring to FIG. 3, it is apparent that as the ratio of $C_{DB}/C_{SB}$ is increased, the voltage applied to the base of transistor Q2 will be increased for a given rate of Drain voltage rise. Thus if $C_{DB}/C_{SB}$ is less than a critical value, Q2 will not turn-on and the MOSFET will be immune to dv/dt inadvertent activation. Unfortunately $C_{DB}/C_{SB}$ cannot be directly measured. However, the $C_{GS1}$ (gate to source up to threshold voltage) and $C_{GD}$ (gate to drain) capacitances are related to the $C_{DB}/C_{SB}$ ratio. Thus, the present inventor has determined that measurement of these two terminal capacitances and determination of their ratio can estimate the tolerance for dv/dt immunity.

Exact measurements of $C_{GD}$ and $C_{GS1}$ are difficult to obtain and are unreliable without expensive and complicated test equipment, and the non-linear characteristics of the capacitances make their calculations complex. To overcome this problem, instead of measuring capacitance directly the present invention utilizes gate charge values with respect to drain ($Q_{GD}$) and threshold gate charge with respect to source ($Q_{GS1}$) to determine dv/dt immunity. It can be shown that if the ratio of ($Q_{GD}$)/($Q_{GS1}$) is less than a predetermined value for a given part and a predetermined application, the dv/dt value will also be low enough to avoid inadvertent turn-on of the parasitic transistor, and that part will be immune to even high dv/dt rates encountered in the application.

Figure 1:
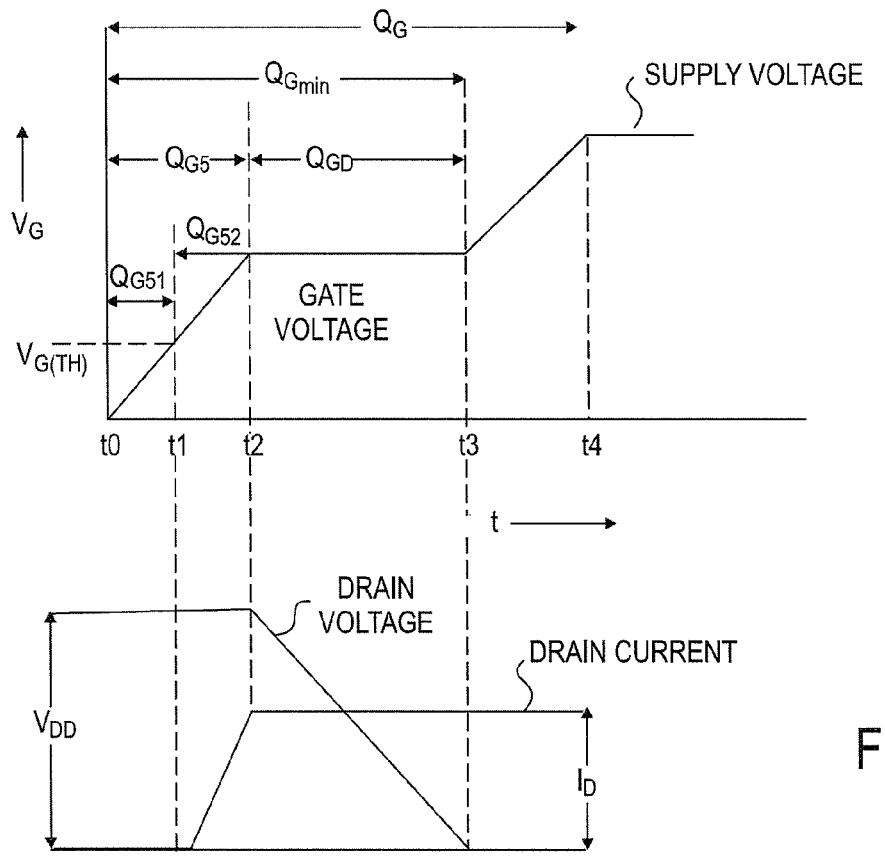
FIG. 1 is a gate charge curve and waveform for a power MOSFET device.
Figure 2:
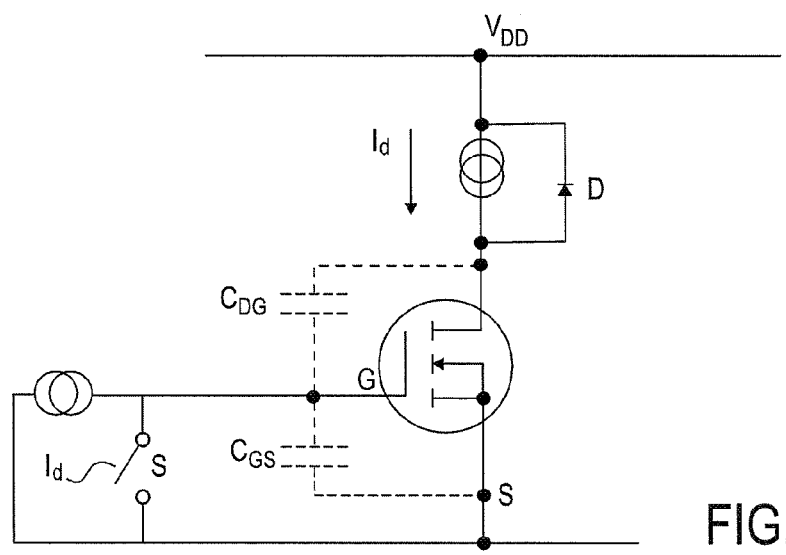
FIG. 2 is a schematic of a test circuit for testing the gate charge of FIG. 1.

Referring now to FIGS. 1 and 2, before time t0 the switch is closed and the gate voltage and the drain voltage are zero. Switch S is opened at time t0, and the gate-to-source capacitance starts to charge, with an increase in the gate-to-source voltage increases. No current flow in drain until the gate reaches the threshold voltage. The charge $Q_{GS1}$ that is accumulated during this period between t0 and t1 is easily quantifiable, and comprises the denominator in the key ratio of the present invention. During period t1 to t2, the gate-to-source capacitance continues to charge, the gate voltage continues to rise, and the drain current rises proportionally. The charge associated with this period is referred to as $Q_{GS2}$, where $Q_{GS1}+Q_{GS2}=Q_{GS}$. As long as the actual drain current $I_d$, is still building up towards the available drain current, $I_D$, the freewheeling rectifier stays in conduction, the voltage across it remains low, and the voltage across device under test (DUT) continues to be virtually the full circuit voltage, $V_{DD}$. The top end of the drain-to-gate capacitance $C_{DG}$ therefore remains at a fixed potential, whilst the potential of the lower end moves with that of the gate. The charging current taken by $C_{DG}$ during this period is small, and for the practical purposes it can be neglected, since $C_{DG}$ is numerically small by comparison with $C_{GS}$.

At time t2, the drain current reaches $I_D$, and the freewheeling rectifier shuts off, and the potential of the drain is no longer tied to the supply voltage, $V_{DD}$. The drain current now stays constant at the value $I_D$, enforced by the circuit, whilst the drain voltage starts to fall. Since the gate voltage is inextricably related to the drain current by the intrinsic transfer characteristic of the DUT (so long as operation remains in the "active" region), the gate voltage now stays constant. For the time being, therefore, no further charge is consumed by the gate-to-source capacitance, because the gate voltage remains constant. Thus the drive current now diverts into "Miller" capacitance $C_{DG}$, and the drive circuit charge now contributes exclusively to discharging the "Miller" capacitance. The drain voltage excursion during the period t2 to t3 is relatively large, and hence the total drive charge is typically higher for the "Miller" capacitance, $C_{DG}$ than for the gate-to-source capacitance $C_{GS}$.

At t3 the drain voltage falls to almost zero and the DUT progresses out of the "active" region of operation, the gate voltage is no longer constrained by the transfer characteristic of the device as it relates to the drain current, and is free to increase. This is does until time t4, when the gate voltage becomes equal to the voltage "behind" the gate circuit current source. The time scale on the oscilloscope of the gate-to-source voltage is directly proportional to the charge delivered by the drive circuit, because charge is equal to the product of current and time, and the current remains constant throughout the whole sequence. Thus the length of the period t0 to t1 represents the charge $Q_{GS1}$ consumed by the gate-to-source capacitance, whilst the length of the period t2 to t3 represents the charge $Q_{GD}$ consumed by the gate-to-drain or "Miller" capacitance. The period t2-t3 is commonly referred to as the Miller plateau. The total charge $Q_{Gmin}$ at time t3 is the charge required to switch the given voltage $V_{DD}$ and current $I_D$.

To apply the method, a gate charge tester such as that identified above and available from Dolian Graphics Inc., or other suitable gate charge tester, is used to obtain the values of $Q_{GS1}$, $Q_{GS}$, $Q_{GD}$, $Q_{Gmin}$, and $Q_G$. From these values, the ratio of $Q_{GD}/Q_{GS1}$ has been found to be the best and most accurate predictor of passing the dv/dt immunity test. The raw data from the gate charge tester is communicated to a computer for converting the raw data to charge values of the gate charge waveform, and then calculating the desired ratios such as $Q_{GD}/Q_{GS1}$, $Q_{GD}/Q_{GS}$, $Q_{GD}/Q_G$, $Q_{Gmin}/Q_G$, and so forth. Other combinations of these charge ratios have been found to supplement and enhance the accuracy of the test of the present invention. Using these values of various permeations of gate charge waveform ratios, the part can be evaluated for worthiness (i.e., pass/fail) and predicted effectiveness and binned accordingly based on the requirements of the particular customer and manufacturer.

The method for carrying out the method described above is illustrative of the present invention. Those of ordinary skill in the art will readily recognize variations of the above-described methods, and such variations should be considered within the scope of the invention. The above described methods are not intended to the limiting in any manner, and the scope of the invention should be measured by the words of the appended claims, taken in their ordinary meaning in conjunction with the specification and documents cited therein.

I claim:

1. A method for testing a power MOSFET using gate charge data for validating the MOSFET comprising the steps of:
    obtaining a gate to drain charge (QGD) of the MOSFET;
    obtaining a gate to source charge at the threshold voltage (QGS1) of the MOSFET;
    dividing the gate to drain charge by the gate to source charge (QGD/QGS1) to obtain a ratio;
    comparing the ratio to a predetermined value; and
    determining a worthiness of the MOSFET based on said comparison of the ratio to the predetermined value.

2. The method for testing a power MOSFET of claim 1 where a second ratio is taken from measured values of a gate charge (QG), gate to drain charge (QGD), and gate to source charge (QGS), and said second ratio is compared to a second predetermined value, and said determining step is based also based on a comparison of said second ratio to said second predetermined value.

* * * * *

UNITED STATES PATENT AND TRADEMARK OFFICE
CERTIFICATE OF CORRECTION

PATENT NO. : 7,397,264 B2
APPLICATION NO. : 11/208800
DATED : July 8, 2008
INVENTOR(S) : Krikor M. Dolian It is certified that error appears in the above-identified patent and that said Letters Patent is hereby corrected as shown below:

Column 3,
Line 20, delete "manufacture" and insert --manufacturers--.

Column 6,
Line 3, delete "does" and insert --done--.
Line 60, delete "based".

Signed and Sealed this

Twenty-third Day of September, 2008

JON W. DUDAS
*Director of the United States Patent and Trademark Office*